United States Patent
Besanger

[11] Patent Number: 5,208,733
[45] Date of Patent: May 4, 1993

[54] ENCLOSURE AND PRINTED CIRCUIT CARD WITH HEAT SINK

[75] Inventor: Michel Besanger, Grenoble, France

[73] Assignee: Merlin Gerin, France

[21] Appl. No.: 785,074

[22] Filed: Oct. 30, 1991

[30] Foreign Application Priority Data

Nov. 9, 1990 [FR] France ................. 90 14016

[51] Int. Cl.⁵ .............................. H05K 7/20
[52] U.S. Cl. ..................... 361/386; 361/388; 361/397; 361/401; 361/412; 165/185; 165/80.4; 257/796
[58] Field of Search ............... 361/380, 381, 382, 385, 361/386, 387, 388, 389, 397, 401, 412; 165/80.4, 185, 104.33; 357/80, 81, 82

[56] References Cited

U.S. PATENT DOCUMENTS

| | | | |
|---|---|---|---|
| 4,315,300 | 2/1982 | Parmerlee et al. | 361/382 |
| 4,603,374 | 7/1986 | Wasielewski | 361/389 |
| 4,768,286 | 9/1988 | Ketcham | 29/841 |

FOREIGN PATENT DOCUMENTS 0340520 11/1989 European Pat. Off. .
1913679 9/1970 Fed. Rep. of Germany .
1258488 12/1971 United Kingdom .

OTHER PUBLICATIONS

Krumm, Chip Cooling, IBM Technical Disclosure Bulletin, vol. 20, No. 7, Dec. 1977.

*Primary Examiner*—Leo P. Picard
*Assistant Examiner*—Young S. Whang
*Attorney, Agent, or Firm*—Parkhurst, Wendel & Rossi

[57] ABSTRACT

An electronic device including a card having first and second faces opposite each other, electrical devices including at least one of a printed circuit and a plurality of components fixed to the first face of the card, a metal plate spaced apart from the card such that a gap is formed therebetween, a pulp filled within the gap which is more thermally conductive than air, and a plastic insulating film disposed between the pulp and the card. The card, electrical components, the plastic insulating film and the metal plate form an integrated assembly.

7 Claims, 4 Drawing Sheets

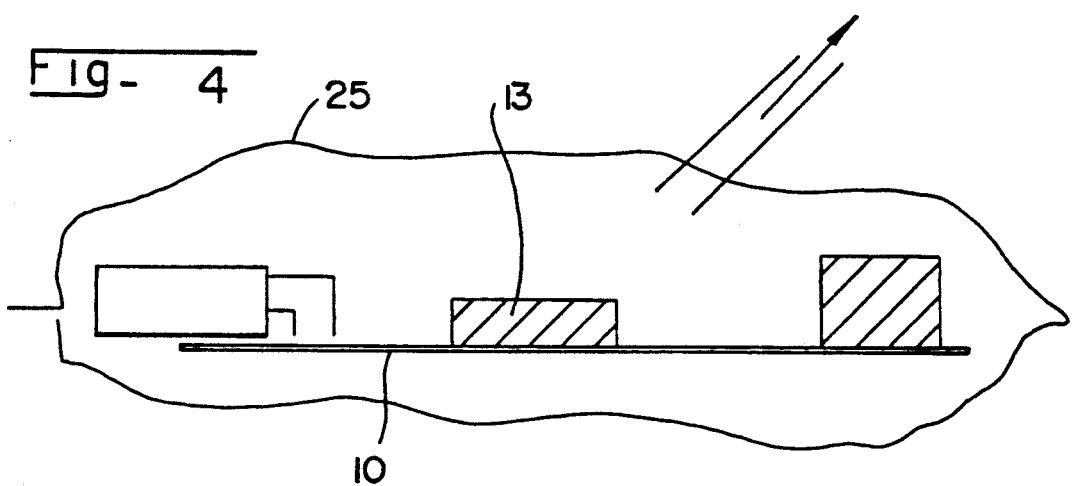
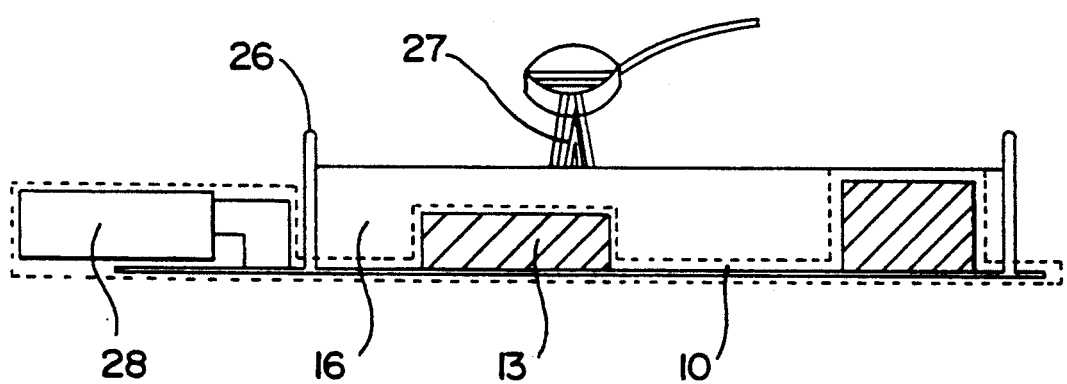
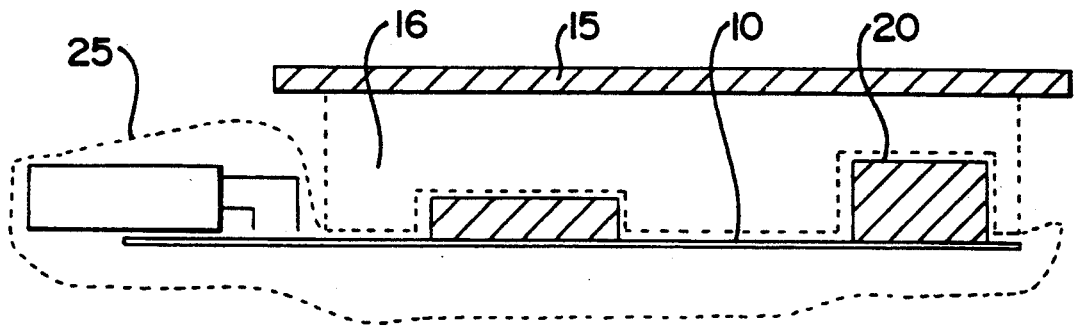

ENCLOSURE AND PRINTED CIRCUIT CARD WITH HEAT SINK

BACKGROUND OF THE INVENTION

The invention relates to an electronic enclosure for housing insulating cards, each card having a printed circuit and electronic components arranged on one of the faces of the card.

Electronic components cannot withstand high temperatures, for example in excess of 150° C., and these temperatures are quickly reached if the heat generated by the components is not removed. The problem of cooling the components is amplified by the fact that a large number of components are assembled on printed circuit cards made of insulating material, and by grouping of these cards together in enclosures which are often tightly sealed and located in poorly ventilated locations. The usual solution is cooling the enclosure or the cards directly by convection by creating forced circulation of air or of a heat removal liquid. These systems require a fan or a pump which is unreliable and which may leak, as well as present other problems.

Another state-of-the-art card cooling system makes use of a heat sink incorporated in the card. This heat sink in the form of a metal plate gives rise to serious problems of electrical insulation, and of good thermal connections with the casings of the components to be cooled. A system of this kind is complicated and not very efficient.

The object of the present invention is to achieve an enclosure and/or card equipped with a particularly simple and efficient solid-state cooling device.

SUMMARY OF THE INVENTION

The enclosure according to the invention is characterized in that each treated card face has associated with it a heat sink in the form of a metal plate, disposed on the components on the opposite side from the card, that the gap between the card and the plate is filled with a pulp having a higher thermal conduction than that of air and that the plate is connected to the enclosure wall by a thermal connector to transfer the heat dissipated by the components to the enclosure.

The metal plate forming the heat sink is placed away from the printed circuit card and the thermal contact with the electronic components of different sizes is ensured by the covering pulp filling the space between the components and the metal plate. The metal plates are in good thermal contact with the enclosure wall, the latter having notably guiding grooves receiving the edges of the plate. It can be understood that the heat generated by the components is transferred via the conducting pulp to the metal plate and enclosure. The pulp follows the exact contour of the component housings and thus ensures contact with the whole surface of these housings. According to an important development of the invention, an insulating plastic film is fitted between the pulp and the card supporting the electronic components. This plastic film, for example formed by a polypropylene film of small thickness, provides both an electrical insulation between the pulp and the electrical circuits supported by the card and a mechanical separation enabling the pulp to be separated or removed from the components to access the latter for repairs or any other operation on the card. This removal of the pulp is made easier by its plasticity.

The pulp is advantageously formed by a silicone resin charged with aluminium nitride or aluminium oxide, the weight percentage of aluminium nitride being comprised between 10 and 80%, and preferably between 50 and 70%. The silicone resin is inserted in liquid state and has the great advantage of cold reticulation preventing any heat rise of the components and card. After reticulation, the resin keeps a sufficient plasticity while ensuring a good thermal conductivity.

The same heat sink plate can support several cards, arranged on a single face of the plate or on both faces, the number being limited by the heat sink capacities of the plate. Both faces of the card can face is treated, i.e. each be associated with a heat sink plate.

The heat sink plate advantageously provides mechanical support for the card, the latter being simply connected by an electrical connector to the fixed part of the enclosure.

When the enclosure is located in a confined space, it is generally indispensable to provide for its cooling, and according to a development of the invention, this cooling is achieved by cooling means. The cooling means enables the heat to be removed to a cold source which may be of any type, for example a heat sink located outside. The cooling water circulates around the enclosure, or preferably, in heat sink plates adjoined to the enclosure walls.

The present invention also relates to the manufacturing process of a printed circuit card, and to the printed circuit card associated with a heat sink in the manner described above. The manufacturing process according to the invention is characterized in that the card with the components is slid into an envelope constituted by a plastic film, that the plastic film is then pressed onto the components by creating a vacuum in the envelope, that a good heat conducting pulp is molded onto the plastic film and that a metal plate is finally applied to said pulp to constitute said heat sink.

By creating a vacuum in the envelope, the latter is pressed onto the card and components following their exact contours. This pressing is reinforced when the liquid silicone is poured into a mold placed beforehand on the card. It is particularly simple to arrange the card horizontally and to place on this card a mold in the form of a frame surrounding the components. In this way, only the face of the card bearing the components is coated with silicone, and the free face of this silicone layer is perfectly flat and horizontal, providing a good contact over the whole surface with the heat sink plate which is advantageously fitted after the molding frame has been removed. The surplus insulating film, in this case a polypropylene film, then merely has to be removed to give access to the electrical connections of the card. The heat sink plate is advantageously made of aluminium or copper, or of any other good heat conducting metal, and its dimensions, notably its thickness, are calculated to ensure sufficient conduction.

The printed circuit cards and electronic components are of standard, single or double format type, and no special precautions have to be taken, the polypropylene insulating film providing mechanical and electrical separation between the card and the heat sinks formed by the pulp and metal plate.

BRIEF DESCRIPTION OF THE DRAWINGS

Other advantages and features will become more clearly apparent from the following description of an illustrative embodiment of the invention, given as a non-restrictive example only and represented in the accompanying drawings, in which:

FIG. 1 is a schematic sectional view of an electronic enclosure according to the invention;

FIGS. 4 to 6 show the different stages of fitting the heat sink on the printed circuit card.

DESCRIPTION OF THE PREFERRED EMBODIMENT

Figure 3:
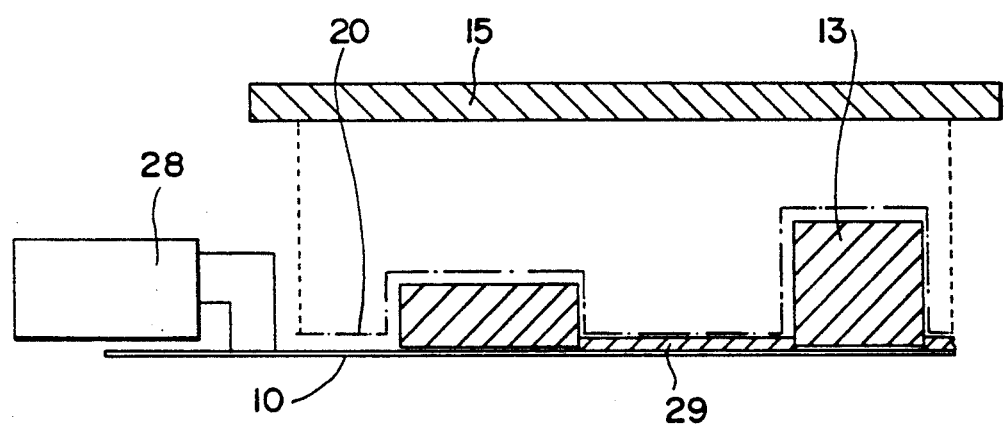
FIG. 3 is a cross-section along the line 3—3 of FIG. 2.

In the Figures, several printed circuit cards 10 are housed in an enclosure 11 of general parallelipipedic shape with metal walls 12. Each card 10 made of insulating material bears a printed circuit 29 and components 13 connected to printed circuit 29, as shown in FIG. 3. These standard type, single or double format cards 10 comprise on one of their edges a terminal strip 14 connected to connector 28, well-known to those specialized in the art. Each card 10 has associated with it a metal plate 15, notably made of aluminium, extending parallel to the card 10, so as to form with the latter a frame around the components 13. The gap between the card 10 and plate 15 is filled with a pulp 16 having a higher thermal conduction than that of air. The pulp 16 and plate 15 constitute heat sinks removing the heat generated by the components 13 by conduction. Two opposite edges 17 of the plate 15 protrude out from the card 10 and are engaged in grooves in the form of slides 18 arranged in the wall 12 of the enclosure 11. A thermal connector 19, engaged in the groove 18, maintains a good mechanical and thermal contact between the edges 17 and the wall of the groove 18. The pulp 16 is advantageously a cold-cast silicone resin comprising a charge of hydrated aluminium oxide or aluminium nitride, the weight percentage of the aluminium nitride being between 10 and 80%, and preferably between 50 and 70%. The percentage of hydrated aluminium oxide is between 50 and 80%. Direct contact between the pulp 16 and components 13 or card 10 is prevented by interposition of a flexible plastic film 20 pressed down on the components 13 and card 10. This plastic film, notably made of polypropylene, of a thickness of a few microns, increases the dielectric withstand and makes it easier to remove the pulp 16 to perform operations on the card 10 in the manner described hereafter.

Almost the entire surface of the casings of the components 13 is in direct contact with the heat sink pulp 16, the presence of the polypropylene film 20 being negligible. The heat generated by the components 13 is conducted by the pulp 16 and plate 15 to the wall 12 of the enclosure 11, thus preventing overheating of the components 13 and the card 10. This cooling system is completely solid-state and reliable.

Figure 1:
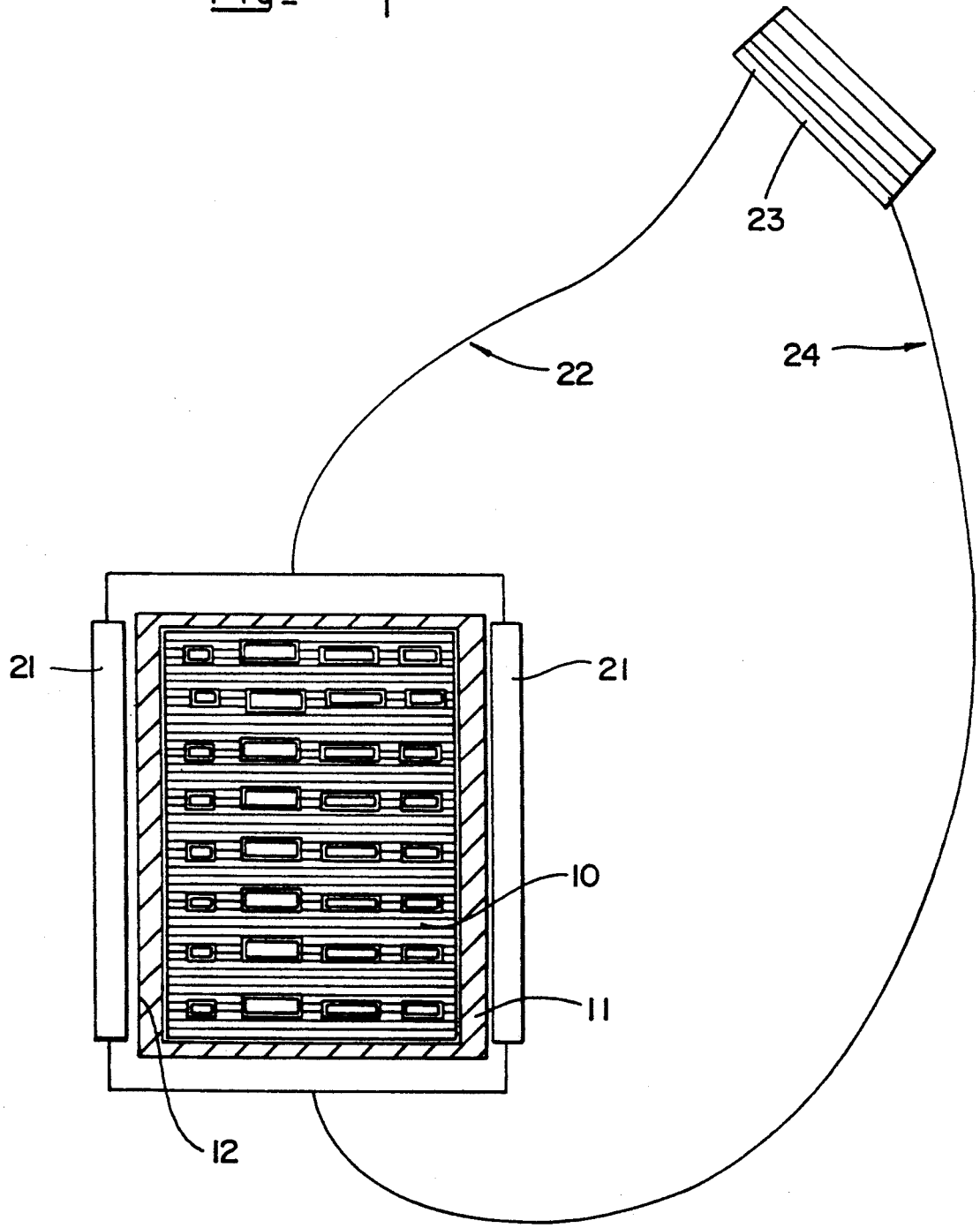
Figure 2:
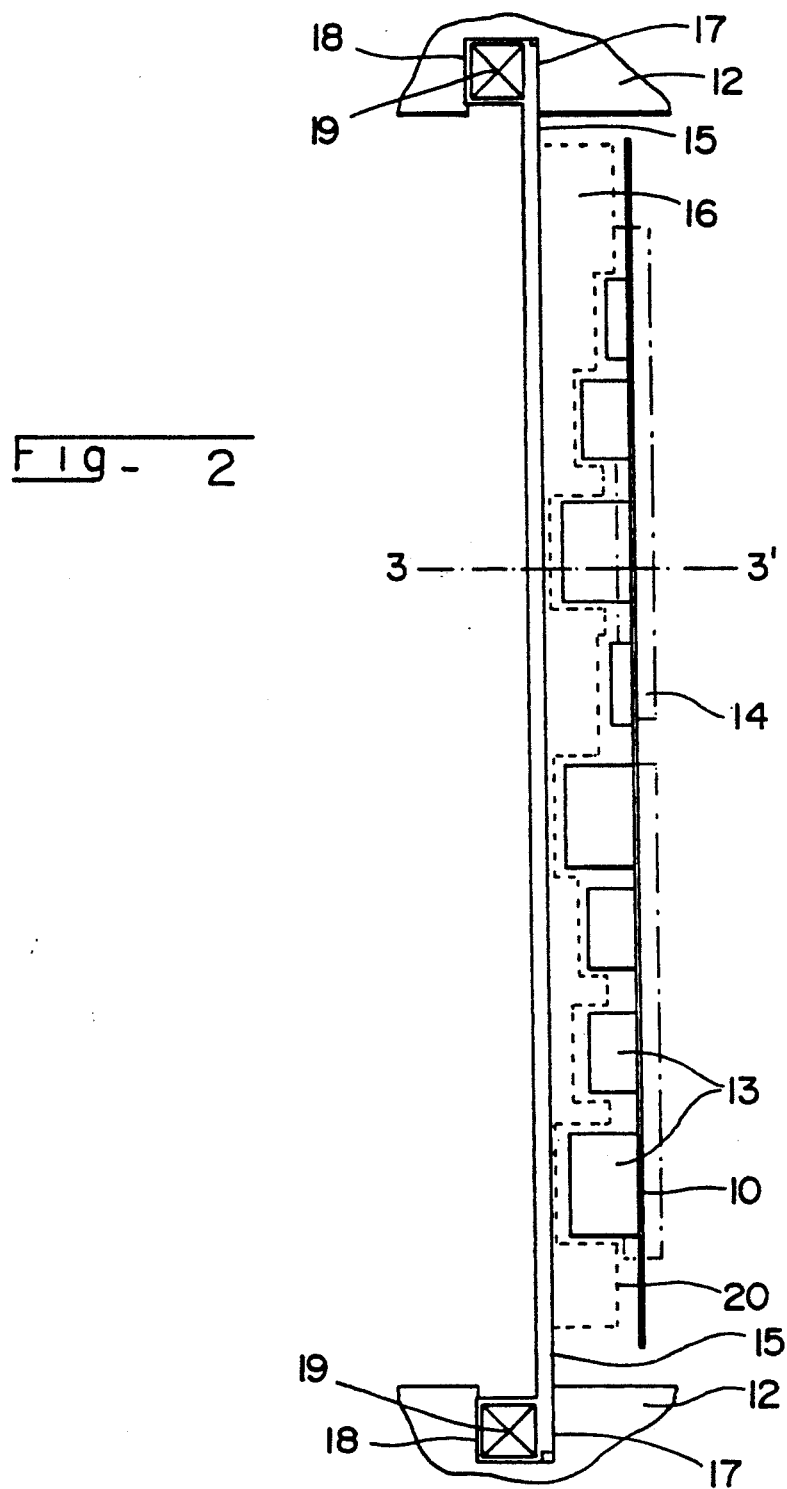
FIG. 2 is an enlarged scale view of a part of FIG. 1.

The wall 12 of the enclosure 11 can constitute a more efficient heat sink if this enclosure is located in a sufficiently low ambient temperature. This enclosure 11 however often needs to be cooled, and referring more particularly to FIG. 1, it can be seen that collecting plates 21 are adjoined in good contact to two walls 12 of the enclosure 11. It is clear that all the walls can comprise cooling plates. The collecting plates 21 contain water circulation ducts (not shown) connected at the top to a water circulation pipe 22 to a cold source or heat sink 23. The bottom of the collecting plates 21 is likewise connected by a pipe 24 to the heat sink 23 which is situated at a higher location in a relatively cold zone with respect to the enclosure 11. It can be seen that the heat sink 23, pipes 22, 24 and collecting plates 21 form a single-phase thermosiphon cooling system enabling calories to be removed from the enclosure 11 to the ambient environment. This system is particularly simple and does not require a circulating pump, any contact between the circuit 21 and electrical part being excluded.

The combination of cooling by heat conduction by the pulp 16 and metal plate 15, heat sinks to the enclosure 11, and the enclosure cooling system by convection via the thermosiphon meets almost all requirements. The plates 15 can form the supports for the cards 10 and the bond formed by the pulp 16 can if necessary be reinforced by any suitable means, notably by nuts and bolts, when this bond proves insufficient. The cards 10 can be arranged in any manner in the enclosure 11 and a second printed circuit card 10 can be associated with the metal plate 15 on the opposite face of this plate. Several printed circuit cards 10 can also be mounted, side by side, on a single plate 15, these cards 10 being either of small format or associated with a plate 15 of larger dimensions.

Associating the heat sink plate 15 to the printed circuit card 10 is advantageously achieved as follows, illustrated by FIGS. 4 to 6.

The standard card 10 with its components 13 is introduced into a sachet or envelope 25 formed by a flexible film, notably made of polypropylene. After this envelope has been closed, a vacuum is created in its so that the plastic film 25 is pressed against the components 13 and card 10. This card 10 with its polypropylene film 25 is placed on a horizontal support and a frame 26 surrounding all the components 13 is placed on its opposite face. The liquid resin 27 is then poured into the mold 26 filling the latter sufficiently to cover all the components 13. Casting is carried out in a cold state and the silicone resin is of the cold reticulation type, enabling, after a predetermined time, for example one to two days, an elastic pulp 16 to be obtained which follows the exact contours of the components 13 and card 10. The connecting terminal 14 is advantageously left outside the molded frame 26, so as to give access to this terminal after the surplus part of the polypropylene film 25 has been removed. After the mold 26 and this surplus part of polypropylene film 25 have been removed, the heat sink plate 15 merely has to be pressed against the free face of the pulp 16 to obtain a card assembly associated with a heat sink. The pulp 16 remains sufficiently flexible to enable this pulp to be removed from the card 10 and components 13 if need be after the card 10 and metal heat sink 15 have been unbolted, separation being rendered easier by the presence of the insulating polypropylene film 20. Other molding processes can be used, notably by injection, and other resins keeping a certain plasticity after reticulation and other changes can be used.

The invention is naturally in no way limited to the embodiment particularly described herein.

We claim:

1. An electronic device comprising:
a card having first and second faces opposite each other;
electrical devices comprising at least one of a printed circuit and a plurality of components fixed to said first face of said card;

a metal plate spaced apart from said card such that a gap is formed between said first face and said metal plate;

pulp filled within said gap, wherein said pulp is more thermally conductive than air; and a plastic insulating film disposed between said pulp and said card, whereby an integrated assembly of said card, said electrical means, said plastic insulating film and said metal plate is formed.

2. The device of claim 1, wherein said pulp completely fills said gap between said first face of said card and said metal plate.

3. The device of claim 1, wherein said pulp comprises a mixture of silicone resin and at least one of 10-80 wt % of aluminum nitride and 50-80 wt % of hydrated aluminum oxide.

4. The device of claim 1, wherein a plurality of card are fixed to said metal plate via said pulp.

5. The device of claim 1, further comprising an enclosure for housing said integrated assembly and a thermal connector connecting said metal plate of said integrated assembly to said enclosure to allow heat flow from said metal plate to said enclosure.

6. The device of claim 2, wherein said metal plate is fixed within a groove formed in a wall of said enclosure to ensure thermal contact between said metal plate and said enclosure.

7. The device of claim 2, further comprising cooling means to convection cool said enclosure, said cooling means comprising a heat sink connected to said enclosure such that heat is transferred from said enclosure to said heat sink.

* * * * *